United States Patent [19]

Hayama

[11] Patent Number: 5,357,137
[45] Date of Patent: Oct. 18, 1994

[54] SEMICONDUCTOR DEVICE

[75] Inventor: Masahide Hayama, Tokyo, Japan

[73] Assignee: Nec Corporation, Tokyo, Japan

[21] Appl. No.: 936,017

[22] Filed: Aug. 27, 1992

[30] Foreign Application Priority Data

Aug. 28, 1991 [JP] Japan .................................. 3-240313

[51] Int. Cl.⁵ ............................................ H01L 29/78
[52] U.S. Cl. .................................... 257/396; 257/400
[58] Field of Search ...................... 257/396, 400, 339

[56] References Cited

U.S. PATENT DOCUMENTS

| | | | |
|---|---|---|---|
| 3,711,753 | 1/1973 | Brand et al. | 257/400 |
| 3,752,711 | 6/1971 | Komi et al. | 257/400 |
| 4,426,766 | 1/1984 | Lee | 257/400 |
| 4,538,166 | 8/1985 | Nakano | 257/400 |
| 4,748,489 | 5/1988 | Komatsu | 257/400 |

*Primary Examiner*—Andrew J. James
*Assistant Examiner*—Stephen D. Meier
*Attorney, Agent, or Firm*—Sughrue, Mion, Zinn, Macpeak & Seas

[57] ABSTRACT

It is the object of this invention to improve the breakdown voltage between the source and the drain of a MOS transistor having radiation resistance. A high concentration impurity having the same polarity as that of the source-drain region is formed below a gate oxide film at both ends in the channel width direction of the source-drain region of the MOS transistor. An impurity region having the same polarity as that of the source-drain region and an impurity concentration lower than that of the source-drain region is formed between the high concentration impurity region and the source-drain region.

6 Claims, 3 Drawing Sheets 5,357,137

SEMICONDUCTOR DEVICE

BACKGROUND OF THE INVENTION

1. Field of the Invention

The present invention relates to a semiconductor device, and more particularly to a semiconductor device with high breakdown voltage having an excellent radiation resistance.

2. Description of the Prior Art

In a conventional MOS transistor, ionization is induced in a silicon oxide film if it is irradiated with beams of radiation such as represented by $\gamma$ rays. Of both positive and negative electric charges that are created by the ionization, the negative charges (electrons) that have a large mobility are annihilated immediately, whereas the positive charges that have a small mobility are left behind within the oxide film. These positive charges are gradually trapped in the area between the oxide film and a substrate, forming fixed charges. An inversion takes place below the oxide film due to these charges, and results in the formation of a parasitic MOS transistor. In particular, this phenomenon is conspicuous in a thick (about 7 to 10 $\mu$m) silicon oxide film such as a field oxide film, causes an undesired leakage current to flow between the source and the drain or between circuit elements, generating a deterioration in the characteristics of the transistor.

In a conventional integrated circuit using MOS transistors, in order to enhance the radiation resistance between the MOS transistors, a high concentration region having polarity different from that of the source-drain region is formed below a thick oxide film as an isolation region between the MOS transistors as shown, for example, in U.S. Pat. No. 4,748,489, to prevent the flow of a leakage current between the circuit elements. However, even if the leakage current between the transistors is prevented, there still remains a drawback in that it is not possible to fully prevent the leakage current between the source and the drain in the individual transistor.

BRIEF SUMMARY OF THE INVENTION

Object of the Invention

It is the object of this invention to provide a semiconductor device which has an improved breakdown voltage obtained by reducing the leakage current between the source and the drain in a MOS transistor having an excellent radiation resistance.

BRIEF DESCRIPTION OF THE DRAWINGS

The above-mentioned and other objects, features and advantages of the present invention will become more apparent from the following detailed description when taken in conjunction with the accompanying drawings, wherein:

FIG. 2 shows the sectional views of the first embodiment of this invention, wherein

FIG. 4 shows the sectional views of the second embodiment of this invention, wherein

SUMMARY OF THE INVENTION

The semiconductor device according to this invention has a high concentration impurity region having a polarity different from that of a source-drain region below gate oxide film at both ends in the channel width direction of the source-drain region of a MOS transistor. In addition, the transistor has an impurity region having the same polarity as that of the source-drain region and an impurity concentration lower than that of the source-drain region between the high concentration impurity region and the source-drain region.

Alternatively, the transistor may have an impurity region having the same polarity as that of the high concentration impurity region and an impurity concentration lower than that of the high concentration impurity region between the high concentration impurity region and the source-drain region.

DETAILED DESCRIPTION OF THE PREFERRED EMBODIMENTS

Figure 1:
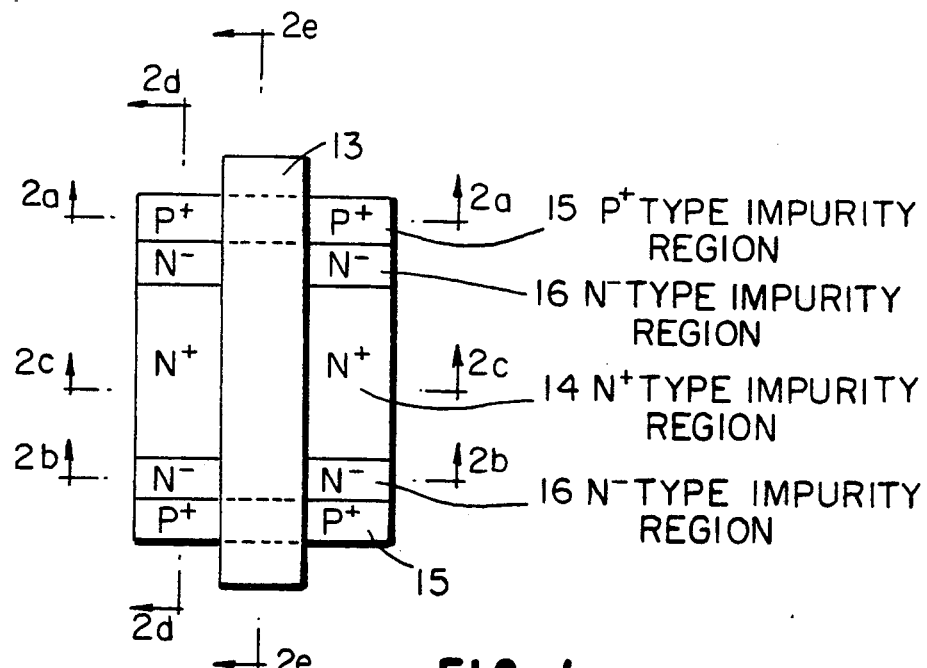
FIG. 1 is a plan view of a first embodiment of this invention.

To describe this invention by referring to FIG. 1 and FIG. 2, the semiconductor device according to the invention has a gate oxide film 12 and a gate electrode 13 formed on a P well 11. In addition, an N+-type source-drain region 14 is formed in the P well 11 with the gate electrode 13 in between. Moreover, a P+-type impurity region 15 is formed on both sides in the channel width direction of the N+-type source-drain region 14. Furthermore, an N−-type impurity region 16 with impurity concentration lower than that of the source-drain region 14 is provided between the P+-type impurity region 15 and the N+-type source-drain region 14. In this case, the P+impurity region 15 traverses below the gate electrode, but the impurity region 16 does not do so. Because of the P+-type impurity region 15 it is possible to prevent the channel formation due to ionizing radiations. When the P+-type region 15 alone is used, the breakdown voltage between the source and the drain is decreased, but this situation can be improved by the provision of the N−-type region 16.

Now, if the impurity concentration of the N−-type impurity region 16 is set to be in the range of $10^{14}$ to $10^{15}$ cm$^{-3}$, and preferably to be $10^{15}$ cm$^{-3}$, and the impurity concentration of the P+-type impurity region 15 is set to be in the range of $10^{12}$ to $10^{14}$ cm$^{-3}$, and preferably to be about $10^{12}$ cm$^{-3}$, it is possible to improve the breakdown voltage between the N+-type source-drain regions 14 to be higher than 10 V. Accordingly, it becomes possible to enhance the radiation resistance to better than 10 KGy(Si) by suppressing the leakage current due to radiations between the source and the drain to about several tens of picoamperes.

Figure 3:
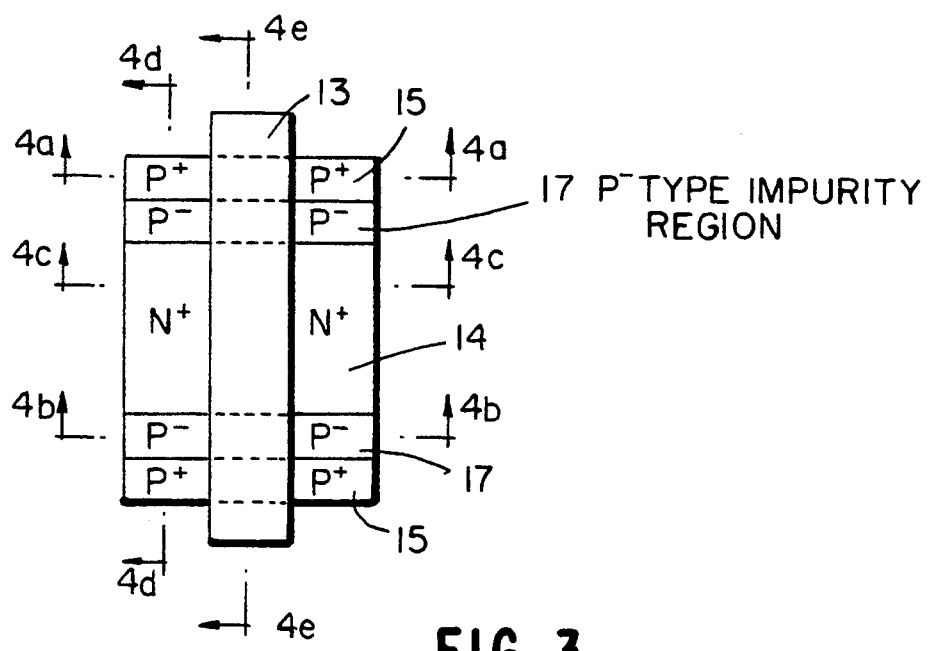
FIG. 3 is a plan view of a second embodiment of this invention.
Figure 2A:
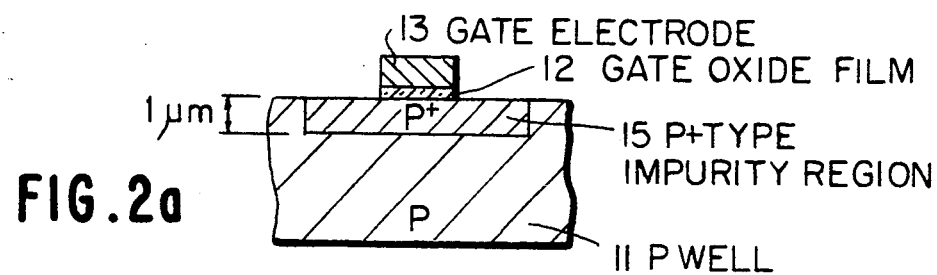
FIG. 2(a) to FIG. 2(e) are sectional views taken along lines AA to EE, respectively, in FIG. 1.
Figure 2B:
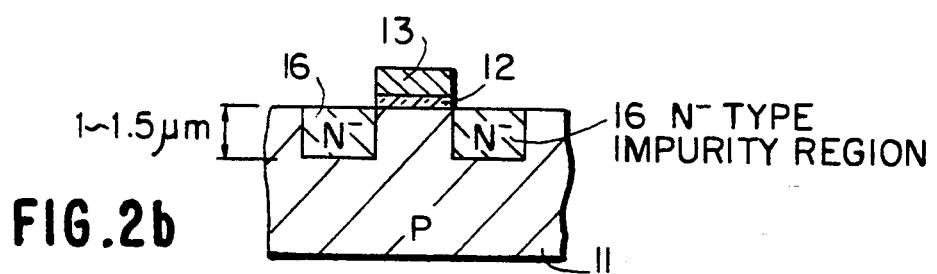
Figure 2C:
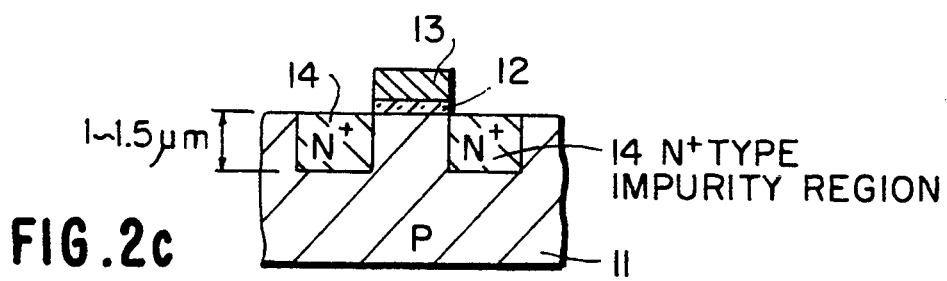
Figure 2D:
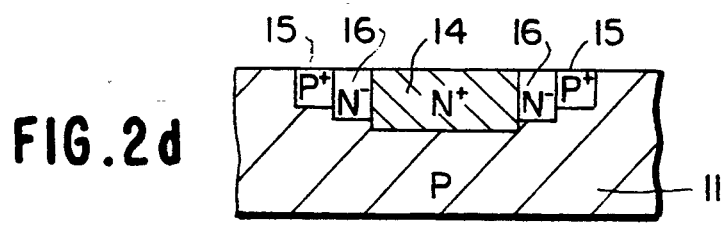
Figure 2E:
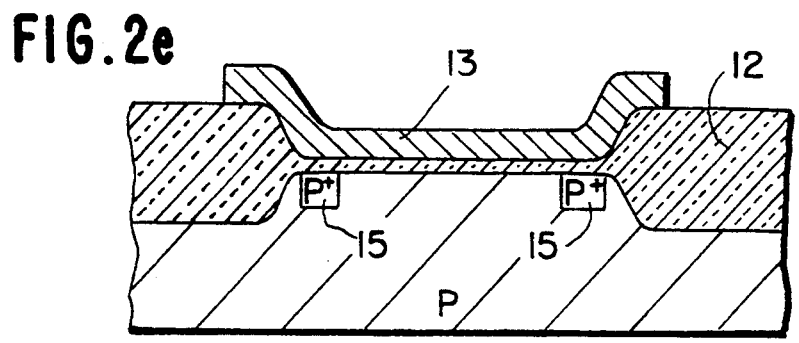
Figure 4A:
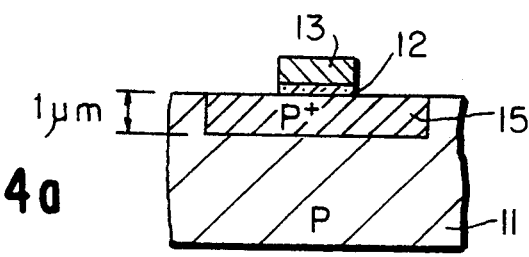
FIG. 4(a) to FIG. 4(e) are sectional views taken along line A'A' to E'E' respectively, in FIG. 3.
Figure 4B:
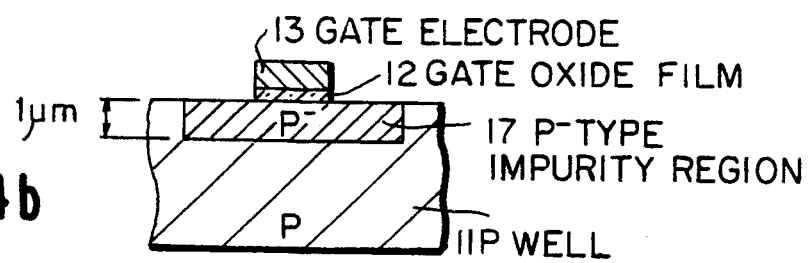
Figure 4C:
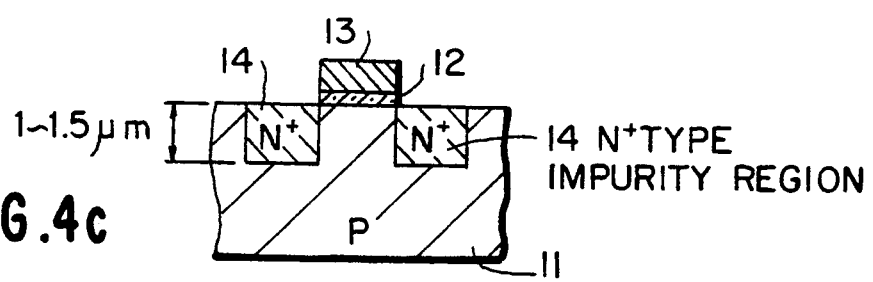
Figure 4D:
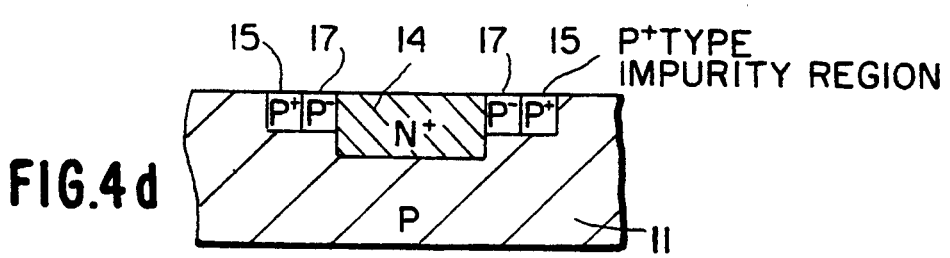
Figure 4E:
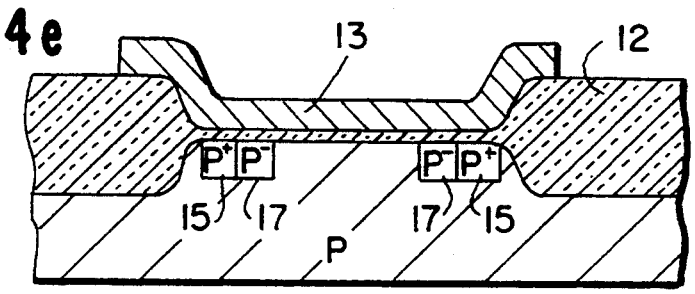

Moreover, in a second embodiment shown in FIG. 3 and FIG. 4, a P−-type impurity region 17 having impurity concentration lower than that of the P+-type impurity region 15 is provided between the N+-type source-drain region 14 and the P+-type impurity region 15. Furthermore, a part of the P+-type impurity region 15 is extended in this embodiment even to the channel region between the P−-type impurity regions. Due to the fact that both of the impurity regions 15 and 17 traverse below the gate electrode the leakage current between the source and the drain can be prevented more effectively.

By constructing the P⁻-type impurity region 17 with the same polarity as that of the P⁺-type impurity region 15 as described in the above, it becomes possible to omit the process of boron ion implantation for the formation of the P⁻-type impurity region 17 in the second embodiment, in contrast to the necessity for the ion implantation of arsenic or phosphorus for the formation of the N⁻-type impurity region 16 in the first embodiment. In other words, an N-channel MOS transistor is formed within a P well when an N-type semiconductor substrate is employed. However, the process of ion implantation for forming the P⁻-type impurity region can be omitted by controlling the impurity concentration of the P well and bringing it close to the impurity concentration ($10^{12}$ to $10^{13}$ cm$^{-3}$ and preferably about $10^{13}$ cm$^{-3}$) of the intended P⁻-type impurity region. Note, however, that the threshold of the transistor is to be controlled by another ion implantation.

What is claimed is:

1. A semiconductor device comprising:
   a semiconductor substrate of a first conductivity type,
   source and drain regions of a second conductivity type formed in said substrate so as to be separated from each other about a first line on said substrate,
   a pair of first impurity regions of said second conductivity type formed in said substrate so as to be connected to opposed ends of said source region and extending parallel to said first line, said first impurity regions having lower impurity concentration than do said source regions,
   a pair of second impurity regions of said second conductivity type formed in said substrate so as to be connected to opposed ends of said drain region and extending parallel to said first line, said pair of second impurity regions having lower impurity concentration than that of said drain regions,
   a pair of third impurity regions of said first conductivity type formed in said substrate and extending along said first line and commonly connected to said pair of first and pair of second impurity regions, respectively, such that said pair of first impurity regions are sandwiched between said source region and said pair of third impurity regions, and said pair of second impurity regions are sandwiched between said drain region and said pair of third impurity regions, said third impurity regions having higher impurity concentration than does said substrate,
   a gate oxide film formed on said substrate, and
   a gate electrode formed on said gate oxide film so as to be located above an area between said source region and said drain region and extending along said first line,
   wherein said first conductivity type is a P-type, the impurity concentration of said first and second impurity regions is set to be in the range of $10^{14}$ cm$^{-3}$ to $10^{15}$ cm$^{-3}$, and the impurity concentration of said third impurity regions is set to be in the range of $10^{12}$ cm$^{-3}$ to $10^{14}$ cm$^{-3}$.

2. A semiconductor device comprising:
   a semiconductor substrate of a first conductivity type,
   source add drain regions of a second conductivity type formed in said surface area so as to be separated from each other about a first line on said substrate,
   a pair of first impurity regions of said first conductivity type formed in said substrate so as to be commonly connected to opposed ends of said source and drain regions and extending parallel to said first line, said pair of first impurity regions having lower impurity concentration than does said substrate.
   a pair of second impurity regions of said first conductivity type formed in said substrate extending parallel to said first line so as to be connected to said pair of first impurity regions, respectively, such that said pair of first impurity regions are respectively sandwiched between said pair of second impurity regions and said source and drain regions, said pair of second impurity regions having higher impurity concentration than does said substrate,
   a gate oxide film formed on said substrate, and
   a gate electrode formed on said gate oxide film so as to be located above an area between said source region and said drain region, and extending along said first line,
   wherein said first and second impurity type is a P-type and the impurity concentration of said second impurity region is set to be in the range of $10^{12}$ cm$^{-3}$ to $10^{14}$ cm$^{-3}$.

3. A semiconductor device comprising:
   a semiconductor substrate of a first conductivity type,
   source and drain regions of a second conductivity type formed in said substrate so as to be separated from each other about a first line on said substrate,
   a pair of first impurity regions of said second conductivity type formed in said substrate so as to be connected to opposed ends of said source region and extending parallel to said first line, said first impurity regions having lower impurity concentration than do said source regions,
   a pair of second impurity regions of said second conductivity type formed in said substrate so as to be connected to opposed ends of said drain region and extending parallel to said first line, said pair of second impurity regions having lower impurity concentration than that Of said drain regions,
   a pair of third impurity regions of said first conductivity type formed in said substrate and extending parallel to said first line and commonly connected to said pair of first and pair of second impurity regions, respectively, such that said pair of first impurity regions are sandwiched between said source region and said pair of third impurity regions, and said pair of second impurity regions are sandwiched between said drain region and said pair of third impurity regions, said third impurity regions having higher impurity concentration than does said substrate,
   a gate oxide film formed on said substrate, and
   a gate electrode formed on said gate oxide film so as to be located above an area between said source region and said drain region and extending along said first line,
   wherein said source and drain regions are deeper in depth than are said first and second impurity regions, and said second impurity region is deeper in depth than is said first impurity region.

4. A semiconductor device comprising:
   a semiconductor substrate of a first conductivity type,
   source and drain regions of a second conductivity type formed in said surface area so as to be separated from each other about a first line on said substrate,
   a pair of first impurity regions of said first conductivity type formed in said substrate so as to be commonly connected to opposed ends of said source and drain regions and extending parallel to said first line, said pair of first impurity regions having lower impurity concentration than does said substrate, a pair of second impurity regions of said first conductivity type formed in said substrate extending parallel to said first line so as to be connected to said pair of first impurity regions, respectively, such that said pair of first impurity regions are respectively sandwiched between said pair of second impurity regions and said source and drain regions, said pair of second impurity regions having higher impurity concentration than does said substrate, a gate oxide film formed on said substrate, and a gate electrode formed on said gate oxide film so as to be located above an area between said source region and said drain region, and extending along said first line, wherein said source and drain regions are deeper in depth than are said first and second impurity regions, and said first impurity region and said second impurity region are substantially equal in depth.

5. A semiconductor device comprising:

a semiconductor substrate provided with a transistor having a gate electrode extending in a first direction, said transistor having $N^+$-type source and drain regions formed in a P-type area of said substrate, a pair of $P^+$-type impurity regions formed in said P-type area of said substrate and elongated in a second direction perpendicular to said first direction, and crossing under said gate electrode such that said source and drain regions extend between said pair of $P^+$-type impurity regions, said $P^+$-type impurity regions having an impurity concentration in a range of $10^{12}$ cm$^{-3}$ to $10^{14}$ cm$^{-3}$ which is higher than that of said P-type area of said substrate, a pair of first $N^-$-type impurity regions formed in said P-type area of said substrate, such that each of said first $N^-$-type impurity regions is located between said source region and said $P^+$-type impurity regions, and a pair of second $N^-$-type impurity regions formed in said P-type area of said substrate, such that each of said second $N^-$-type impurity regions is located between said drain region and said $P^+$-type impurity regions, said first and second $N^-$-type impurity regions having an impurity concentration in a range of $10^{14}$ cm$^{-3}$ to $10^{15}$ cm$^{-3}$ which is lower than that of said $N^+$-type source and drain regions.

6. A semiconductor device comprising:

a semiconductor substrate provided with a transistor having a gate electrode extending in a first direction, said transistor having $N^+$-type source and drain regions formed in a P-type area of said substrate, a pair of $P^+$-type impurity regions formed in said P-type area of said substrate and elongated in a second direction perpendicular to said first direction, and crossing under said gate electrode such that said source and drain regions extend between said pair of $P^+$-type impurity regions, said $P^+$-type impurity regions having an impurity concentration in a range of $10^{12}$ cm$^{-3}$ to $10^{14}$ cm$^{-3}$ which is higher than that of said P-type area of said substrate, and a pair of $P^-$-type impurity regions formed in said P-type area of said substrate such that each of said first $P^-$-type impurity regions is located between said $P^+$-type impurity regions and said source and drain regions.

* * * * *